United States Patent
Fujita

(10) Patent No.: US 9,589,813 B2
(45) Date of Patent: Mar. 7, 2017

(54) STAGE UNIT AND LASER ANNEALING APPARATUS INCLUDING THE SAME

(71) Applicant: Samsung Display Co., Ltd., Yongin, Gyeonggi-Do (KR)

(72) Inventor: Hiroyuki Fujita, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 882 days.

(21) Appl. No.: 13/962,875

(22) Filed: Aug. 8, 2013

(65) Prior Publication Data

US 2014/0209578 A1 Jul. 31, 2014

(30) Foreign Application Priority Data

Jan. 29, 2013 (KR) .................. 10-2013-0009701

(51) Int. Cl.
*B23K 26/00* (2014.01)
*H01L 21/324* (2006.01)
*H01L 21/677* (2006.01)
*H01L 21/68* (2006.01)

(52) U.S. Cl.
CPC ...... *H01L 21/324* (2013.01); *H01L 21/67784* (2013.01); *H01L 21/68* (2013.01)

(58) Field of Classification Search
CPC .. H01L 21/67784; H01L 21/324; H01L 21/68
USPC ............ 219/121.65, 121.73, 121.74, 121.75, 219/121.77
See application file for complete search history.

(56) References Cited

U.S. PATENT DOCUMENTS

| 5,730,575 A * | 3/1998 | Nichols ............ H01L 21/67775 118/500 |
| 2003/0136512 A1 * | 7/2003 | Yamamoto ................ G03F 1/64 156/345.26 |
| 2008/0105665 A1 * | 5/2008 | Kondo ................. B23K 26/067 219/121.77 |
| 2010/0089886 A1 * | 4/2010 | Sercel .................... B23K 26/16 219/121.72 |

FOREIGN PATENT DOCUMENTS

| KR | 10-2011-0032673 A | 3/2011 |
| KR | 10-2011-0140053 A | 12/2011 |
| KR | 10-2012-0103487 A | 9/2012 |

* cited by examiner

*Primary Examiner* — Phuong Nguyen
(74) *Attorney, Agent, or Firm* — Knobbe Martens Olson & Bear LLP

(57) ABSTRACT

A stage unit may include a frame, a first guide device, a stage, a second guide device and a pad. The first guide device may be arranged over an upper surface of the frame and configured to guide the stage in a first direction. The stage may be movably connected to the first guide device. The second guide device may be arranged over an upper surface of the stage and configured to guide the pad in a second direction substantially perpendicular to the first direction. The pad may be movably connected to the second guide device and configured to support a substrate. Therefore, the substrate may be supported by and uniformly floated by the frame, the stage and the pad.

16 Claims, 3 Drawing Sheets

STAGE UNIT AND LASER ANNEALING APPARATUS INCLUDING THE SAME

CROSS-REFERENCE TO RELATED APPLICATION

This application claims priority under 35 USC §119 to Korean Patent Application No. 10-2013-0009701, filed on Jan. 29, 2013 in the Korean Intellectual Property Office (KIPO), the contents of which are herein incorporated by reference in its entirety.

BACKGROUND

1. Field

The present disclosure relates to a stage unit and a laser annealing apparatus including the same. More particularly, example embodiments relate to a stage unit for supporting a substrate, and a laser annealing apparatus including the stage unit for crystallizing an amorphous silicon layer into a polysilicon layer.

2. Related Technology

Generally, a laser may be used for crystallizing an amorphous silicon layer on a glass substrate into a polysilicon layer. During the foregoing process, the glass substrate may be supported by a stage unit. Such stage unit may have several members to move the glass substrate and float the glass substrate.

SUMMARY

One aspect provides a stage unit that may be capable of uniformly floating a glass substrate.

Another aspect provides a laser annealing apparatus including the above-mentioned stage unit.

Embodiments provide a stage unit. The stage unit may include a frame, a first guide device, a stage, a second guide device and a pad. The first guide device may be arranged over an upper surface of the frame. The stage may be movably connected to the first guide device. The first guide device may be configured to guide movement of the stage in a first direction. The second guide device may be arranged over an upper surface of the stage. The pad may be movably connected to the second guide device to support a substrate. The second guide device is configured to guide the pad in a second direction substantially perpendicular to the first direction.

In example embodiments, the stage unit may further include a plurality of mounts mounted over a lower surface of the frame.

In example embodiments, at least some of the mounts may be arranged on the lower surface of the frame in a diagonal direction of the frame.

In example embodiments, the pad may include a floating pad configured to float the substrate.

In example embodiments, the floating pad may have a plurality of air holes.

In example embodiments, the floating pad may include ceraphite.

In example embodiments, the first guide device may include at least one side guide arranged over side edge portions of the upper surface of the frame, and at least one central guide arranged over a central portion of the upper surface of the frame.

In example embodiments, the at least one side guide may include a pair of guides.

In example embodiments, the at least one central guide may include three guides arranged by substantially the same interval.

Embodiments provide a stage unit. The stage unit may include a frame, a plurality of mounts, a first guide device, a stage, a second guide device and a floating pad. The mounts may be arranged over a lower surface of the frame in a diagonal direction of the frame. The first guide device may include at least one side guide arranged over each of side edge portions of an upper surface of the frame, and at least one central guide arranged over a central portion of the upper surface of the frame. The stage may be movably connected to the first guide device. The first guide device may be configured to guide movement of the stage in a first direction. The second guide device may be arranged over an upper surface of the stage. The second guide device may be configured to guide the floating pad in a second direction substantially perpendicular to the first direction. The floating pad may be movably connected to the second guide device and configured to float a substrate.

In example embodiments, the floating pad may include ceraphite.

In example embodiments, each of the side guides may include a pair of guides.

In example embodiments, the at least one central guide may include three guides arranged by substantially the same interval.

Embodiments provide a laser annealing apparatus. The laser annealing apparatus may include a frame, a first guide device, a stage, a second guide device, a pad and a laser-irradiating unit. The first guide device may be arranged over an upper surface of the frame. The stage may be movably connected to the first guide device. The first guide device may be configured to guide movement of the stage in a first direction. The second guide device may be arranged over an upper surface of the stage. The second guide device may be configured to guide the pad in a second direction substantially perpendicular to the first direction. The pad may be movably connected to the second guide device and configured to support a substrate. The laser-irradiator unit may be arranged over an upper surface of the pad and configured to irradiate a laser beam to the substrate supported by the pad to crystalline an amorphous silicon layer of the substrate into a polysilicon layer.

In example embodiments, the laser-irradiator unit may include a laser source configured to generate the laser beam, and an optical member configured to concentrate the laser beam onto the substrate.

According to example embodiments, the first guide device may firmly support the stage. Further, the mounts arranged in the diagonal direction may firmly support the frame. Furthermore, the floating pad may include ceraphite having strength and hardness sufficient to minimize deformation and/or wear. Particles may not be adhered to the ceraphite. Therefore, the substrate may be supported and uniformly floated by the frame, the stage and the floating pad.

BRIEF DESCRIPTION OF THE DRAWINGS

Example embodiments will be more clearly understood from the following detailed description taken in conjunction with the accompanying drawings.

FIG. 1 is a perspective view illustrating a stage unit in accordance with example embodiments;

FIG. 2 is a perspective view illustrating a bottom surface of a frame in the stage unit of FIG. 1;

FIG. 3 is an enlarged perspective view illustrating a first guide device of the stage unit in FIG. 1; and FIG. 4 is a perspective view illustrating a laser annealing apparatus including the stage unit in FIG. 1.

DESCRIPTION OF EMBODIMENTS

Figure 1:
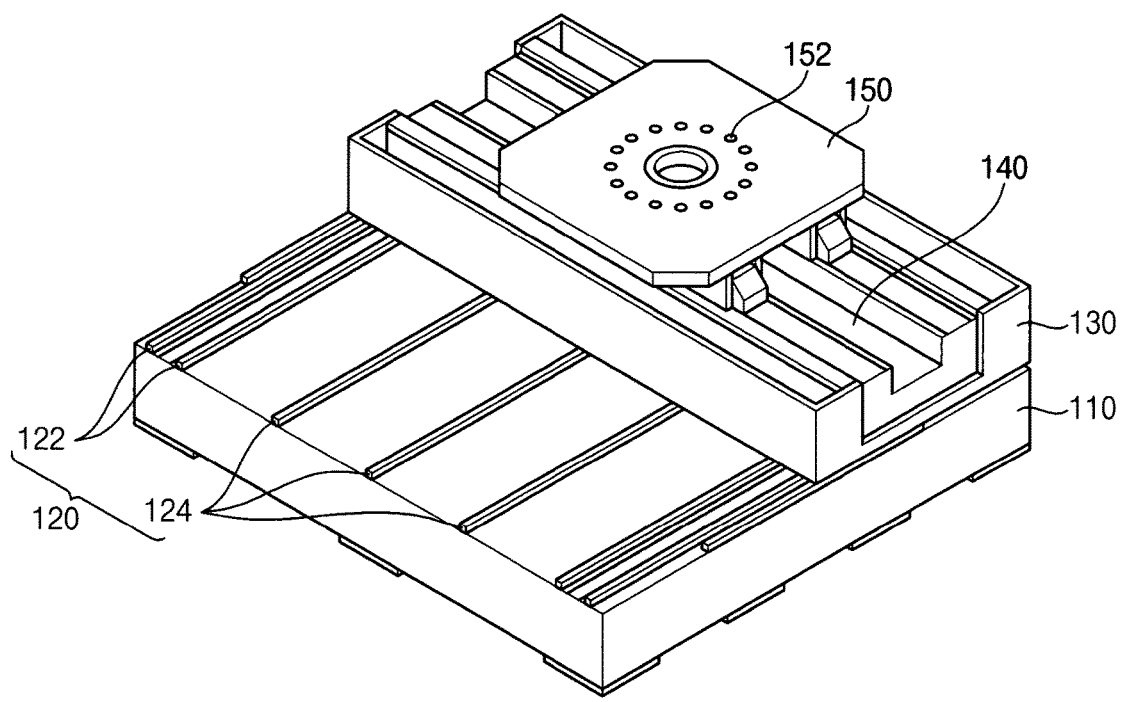
FIGS. 1 to 4 represent non-limiting, embodiments as described herein.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A stage unit may include a frame, a stage arranged on the frame, and a floating pad installed on the stage to float a glass substrate. The frame may be supported by a plurality of mounts. The stage may be movably connected to a guide device arranged on the frame.

In order to float the glass substrate by the floating pad to a uniform height, it may be required to firmly support the frame by using the mounts. Further, it may also be required to firmly support the moving stage by the guide device. Furthermore, it may be required to prevent particles from being adhered to the floating pad.

Stage Unit

Figure 2:
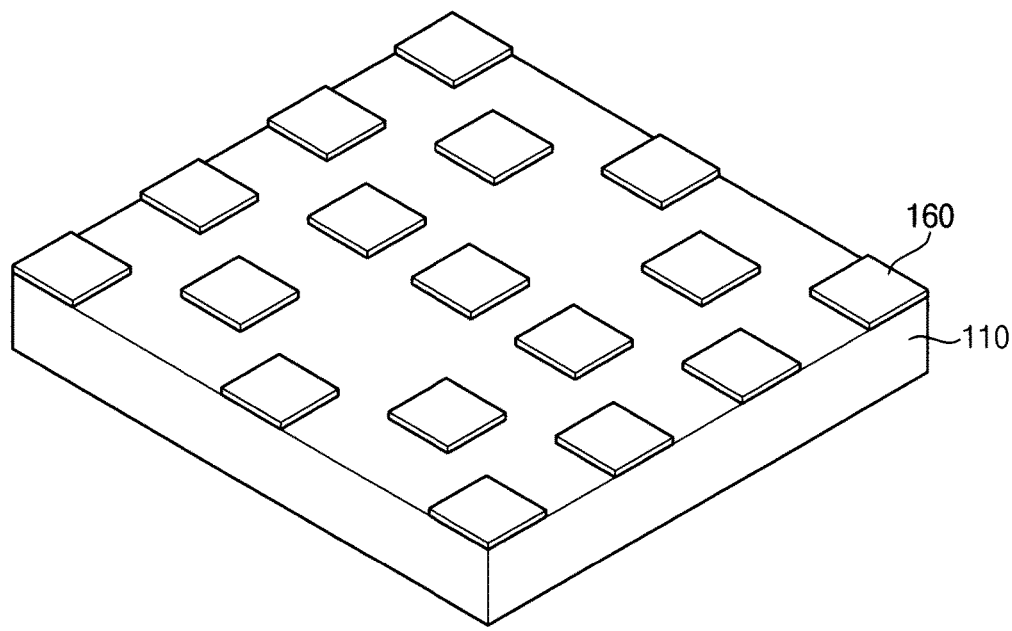
Figure 3:
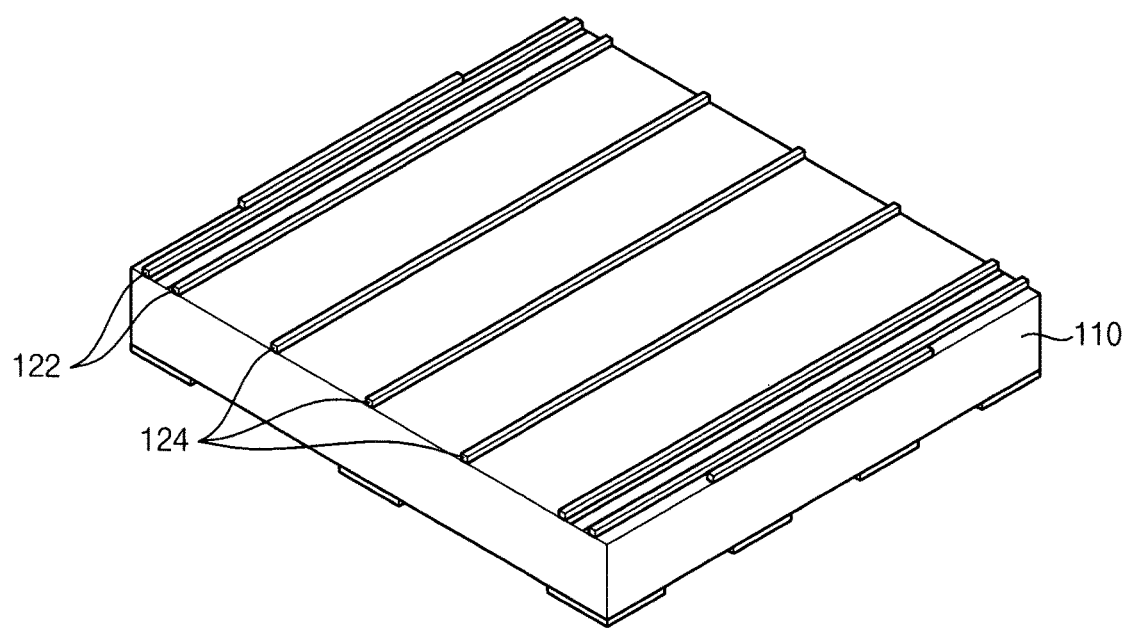

FIG. 1 is a perspective view illustrating a stage unit in accordance with example embodiments, FIG. 2 is a perspective view illustrating a bottom surface of a frame in the stage unit of FIG. 1, and FIG. 3 is an enlarged perspective view illustrating a first guide device of the stage unit in FIG. 1.

Referring to FIGS. 1 to 3, a stage unit 100 of this example embodiment may include a frame 110, a first guide device 120, a stage 130, a second guide device 140, a pad 150 and mounts 160.

In example embodiments, the frame 110 may have a rectangular parallelepiped shape. The frame 110 may be fixed to an upper surface of a working table (not shown) using the mounts 160. The mounts 160 may be arranged on a lower surface of the frame 110. As illustrated, at least some of the mounts 160 are arranged in a diagonal direction of the frame 110. In some embodiments, the mounts 160 may have a honeycomb structure to firmly support the frame 110. The mounts 160 may be installed on the lower surface of the frame 110 by a welding process.

The first guide device 120 may be arranged on an upper surface of the frame 110. The first guide device 120 may be arranged on the upper surface of the frame 110 to guide the movement of the stage 130 in a first direction. In example embodiments, the first guide device 120 may include side guides 122 and a central guide 124.

In embodiments, the side guides 122 may be arranged on two opposite side edge portions of the upper surface of the frame 110, respectfully. In example embodiments, a pair of guides may be placed on each of the side edge portions of the upper surface of the frame 100 as side guides. Alternatively, a single guide may be provided on each of the side edge portions of the upper surface of the frame 100 as a side guide. At least three guides may be provided on each of the side edge portions of the upper surface of the frame 100 as a side guides.

The central guide 124 may be arranged on a central portion of the upper surface of the frame 110. In example embodiments, three guides may be provided on the central portion of the upper surface of the frame 110 as central guides and spaced apart from each other by substantially the same interval. Alternatively, a single guide may be provided on the central portion of the upper surface of the frame 110 as a central guide. In another embodiment, two guides or at least four guides may be provided on the central portion of the upper surface of the frame 110 as central guides.

The stage 130 may be movably connected to the first guide device 120. Thus, the stage 130 may be moved on the first guide device 120 in the first direction.

In example embodiments, the side guide 122 may support edge portions of a lower surface of the stage 130, allowing the stage 130 to move in the first direction. The central guide 124 may movably support a central portion of the lower surface of the stage 130, allowing the stage 130 to move in the first direction. Thus, because the stage 130 may be supported by the central guide 124 as well as the side guide 122, supporting strength of the stage 130 may be increased.

The second guide member 140 may be arranged on an upper surface of the stage 130 to guide the movement of the pad 150 in a second direction. The second direction may be substantially perpendicular to the first direction. In example embodiments, the second guide device 140 may include a plurality of guides.

The pad 150 may be movably connected to the second guide device 140. Therefore, the pad 150 may be moved on the second guide device 140 in the second direction. As a result, the pad 150 may be moved in the first direction and the second direction.

The pad 150 may support a substrate such as a glass substrate, a semiconductor substrate, etc. The substrate may be placed on an upper surface of the pad 150. In example embodiments, the pad 150 may include a floating pad configured to float the substrate. Thus, the floating pad 150 may have a plurality of air holes 152 for floating the substrate. In example embodiments, the floating pad 150 may include ceraphite to which particles may not be adhered. In embodiments, the pad 150 may have a circular horizontal cross-section, and a rectangular horizontal cross-section.

Alternatively, the pad 150 may include a vacuum pad for fixing the substrate using vacuum. Vacuum holes may be formed through the vacuum pad.

According to embodiments, the honeycomb mounts may firmly support the frame. Further, the first guide device may firmly support the stage. The floating pad may include the ceraphite to which the particles may not be adhered. Therefore, the substrate may be stably floated from the pad.

Laser Annealing Apparatus

Figure 4:
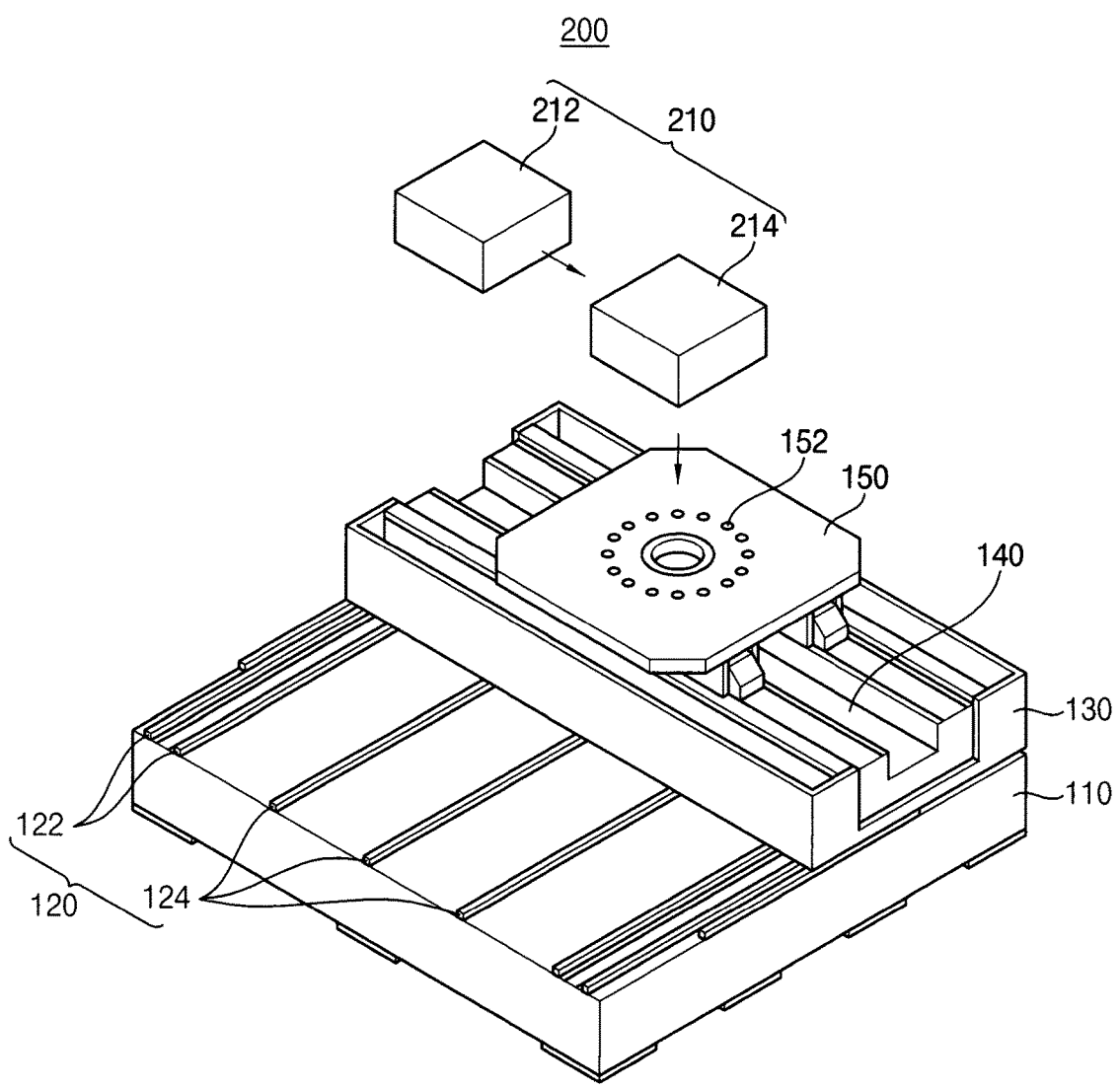

FIG. 4 is a perspective view illustrating a laser annealing apparatus including the stage unit in FIG. 1.

Referring to FIG. 4, a laser annealing apparatus 200 of this example embodiment may include a stage unit 100 and a laser-irradiating unit or laser irradiator 210. In example embodiments, the laser annealing apparatus 200 may crystalline an amorphous silicon layer on the glass substrate into a polysilicon layer using a laser.

In example embodiments, the stage unit 100 may include elements substantially the same as those of the stage unit 100 in FIG. 1. Thus, the same reference numerals may refer to the same elements, and any further illustrations with respect to the same elements may be omitted herein for brevity.

The laser-irradiating unit 210 may be arranged above the upper surface of the pad 150 and irradiate the laser to the glass substrate on the pad 150. In example embodiments, the laser-irradiating unit 210 may include a laser source 212 for generating the laser, and an optical member 214 for concentrating the laser onto the pad 150.

In example embodiments, the stage unit 100 may be included in the laser annealing apparatus 200. Alternatively, the stage unit 100 may be applied to other apparatuses for processing the substrate.

According to example embodiments, the first guide device may firmly support the stage. Further, the mounts arranged in the diagonal direction may firmly support the frame. Furthermore, the floating pad may include ceraphite having a high strength and a high hardness. Particles may not be adhered to the ceraphite. Therefore, the substrate may be supported and uniformly floated by the frame, the stage and the floating pad.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A stage unit comprising:
   a frame;
   a first guide device arranged over an upper surface of the frame and comprising:
      at least one side guide arranged over each of side edge portions of the upper surface of the frame, wherein the at least one side guide comprises a pair of guides; and
      at least one central guide arranged over a central portion of the upper surface of the frame, the at least one central guide comprises three guides spaced apart from each other by substantially the same interval;
   a stage movably connected to the first guide device, wherein the first guide device is configured to guide movement of the stage in a first direction;
   a second guide device arranged over an upper surface of the stage; and
   a pad movably connected to the second guide device and configured to support a substrate, wherein the second guide device is configured to guide the pad in a second direction substantially perpendicular to the first direction, wherein the first guide device has a width extending in the second direction, wherein the second guide device has a length extending in the second direction, and wherein the width of the first guide device and the length of the second guide device are substantially the same.

2. The stage unit of claim 1, further comprising a plurality of mounts mounted over a lower surface of the frame.

3. The stage unit of claim 2, wherein at least some of the mounts are arranged in a diagonal direction of the frame.

4. The stage unit of claim 2, wherein the plurality of mounts includes more than four mounts.

5. The stage unit of claim 2, wherein the plurality of mounts have a height that is less than the thickness of the frame.

6. The stage unit of claim 1, wherein the pad comprises a floating pad configured to float the substrate.

7. The stage unit of claim 6, wherein the floating pad has a plurality of air holes.

8. The stage unit of claim 6, wherein the floating pad comprises ceraphite.

9. The stage unit of claim 1, wherein the pair of guides of the at least one side guide are spaced apart from each other by a first interval, wherein the three guides of the at least one central guide are spaced apart from one another by a second interval, and wherein the first interval is less than the second interval.

10. The stage unit of claim 1, wherein the pad has two legs that are directly connected to the second guide device.

11. A stage unit comprising:
a frame;
a plurality of mounts mounted over a lower surface of the frame;
a first guide device including i) at least one side guide that is arranged over each of the side edge portions of an upper surface of the frame and ii) at least one central guide arranged over a central portion of the upper surface of the frame, wherein the at least one side guide comprises a pair of guides, and wherein the at least one central guide comprises three guides spaced apart from each other by substantially the same interval;
a stage movably connected to the first guide device, wherein the first guide device is configured to guide movement of the stage in a first direction;
a second guide device arranged over an upper surface of the stage; and
a floating pad movably connected to the second guide device and configured to float a substrate, wherein the second guide device is configured to guide the floating pad in a second direction substantially perpendicular to the first direction, wherein the first guide device has a width extending in the second direction, wherein the second guide device has a length extending in the second direction, and wherein the width of the first guide device and the length of the second guide device are substantially the same.

12. The stage unit of claim 11, wherein the floating pad comprises ceraphite.

13. The stage unit of claim 11, wherein the at least one side guide comprises a pair of guides.

14. The stage unit of claim 11, wherein the at least one central guide comprises three guides spaced apart from each other by substantially the same interval.

15. A laser annealing apparatus comprising:
a frame;
a first guide device arranged over an upper surface of the frame and comprising:
at least one side guide arranged over each of side edge portions of the upper surface of the frame, wherein the at least one side guide comprises a pair of guides; and
at least one central guide arranged over a central portion of the upper surface of the frame, the at least one central guide comprises three guides spaced apart from each other by substantially the same interval;
a stage movably connected to the first guide device, wherein the first guide device is configured to guide movement of the stage in a first direction;
a second guide device arranged over an upper surface of the stage;
a pad movably connected to the second guide device and configured to support a substrate, wherein the second guide device is configured to guide the pad in a second direction substantially perpendicular to the first direction; and
a laser-irradiator unit arranged over the pad, the laser-irradiator unit configured to irradiate a laser beam to the substrate supported by the pad to crystalline an amorphous silicon layer of the substrate into a poly silicon layer, wherein the first guide device has a width extending in the second direction, wherein the second guide device has a length extending in the second direction, and wherein the width of the first guide device and the length of the second guide device are substantially the same.

16. The laser annealing apparatus of claim 15, wherein the laser-irradiator unit comprises:
a laser source configured to generate the laser beam; and
an optical member configured to concentrate the laser beam onto the substrate.

* * * * *